(12) United States Patent
Chong et al.

(10) Patent No.: US 7,509,223 B2
(45) Date of Patent: Mar. 24, 2009

(54) READ-SIDE CALIBRATION FOR DATA INTERFACE

(75) Inventors: Yan Chong, San Jose, CA (US);
Chiakang Sung, Milpitas, CA (US);
Joseph Huang, Morgan Hill, CA (US);
Michael H. M. Chu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/735,386

(22) Filed: Apr. 13, 2007

(65) Prior Publication Data

US 2007/0282555 A1 Dec. 6, 2007

Related U.S. Application Data

(60) Provisional application No. 60/793,838, filed on Apr. 21, 2006, provisional application No. 60/793,864, filed on Apr. 21, 2006.

(51) Int. Cl.
*G06F 3/00* (2006.01)
(52) U.S. Cl. .................... 702/107; 702/85; 702/89; 702/92
(58) Field of Classification Search ............. 702/69, 702/107, 108, 117, 119, 120, 85, 89, 92; 324/158.1; 365/145; 714/719
See application file for complete search history.

(56) References Cited

U.S. PATENT DOCUMENTS

| | | | |
|---|---|---|---|
| 5,953,284 A | 9/1999 | Baker et al. | |
| 6,041,417 A | 3/2000 | Hammond et al. | |
| 6,147,963 A | 11/2000 | Walker et al. | |
| 6,338,127 B1 | 1/2002 | Manning | |
| 6,518,794 B2 * | 2/2003 | Coteus et al. | 326/93 |
| 6,647,523 B2 | 11/2003 | Manning | |
| 2003/0191995 A1* | 10/2003 | Abrosimov et al. | 714/719 |
| 2005/0047192 A1* | 3/2005 | Matsui et al. | 365/145 |
| 2007/0132443 A1* | 6/2007 | LaBerge | 324/158.1 |

OTHER PUBLICATIONS

U.S. Appl. No. 11/040,324, Thorne.
"An Innovated Sekw Locked Loop to Improve Read Timing Margin for External Memory Interface Applications in FPGA Devices"; http://www.priorartdatabase.com/ipcou/000139945, 6 pages.

* cited by examiner

*Primary Examiner*—Eliseo Ramos Feliciano
*Assistant Examiner*—Felix E Suarez
(74) *Attorney, Agent, or Firm*—Townsend and Townsend and Crew LLP; David B. Raczkowski

(57) ABSTRACT

Circuits, methods and apparatus are provided to reduce skew among signals being received by a data interface. Signal path delays are varied such that data and strobe signals received at a memory interface are calibrated or aligned with each other along a rising and/or falling edge. For example, self-calibration circuitry provides skew adjustment of each data signal path by determining one or more delays in each data signal path and strobe signal path based on relative timings of test signals. The rising or falling edges may be used for this alignment.

23 Claims, 5 Drawing Sheets

READ-SIDE CALIBRATION FOR DATA INTERFACE

CROSS-REFERENCES TO RELATED APPLICATIONS

This application claims the benefit of U.S. provisional patent application No. 60/793,838 filed Apr. 21, 2006, entitled "A Read Side Calibration Scheme to Improve Read Timing Margin for External Memory Interface Applications in FPGA Devices," by Yan Chong et al., the disclosure of which is incorporated herein by reference in its entirety.

This application is related to U.S. Provisional Application No. 60/793,864, filed Apr. 21, 2006, entitled "Write-Side Calibration," by Yan Chong et al.; to concurrently filed and commonly owned U.S. patent application Ser. No. 11/735,395 "Write-Side Calibration for Data Interface" by Yan Chong et al: and to concurrently filed and commonly owned U.S. patent application Ser. No. 11/735,401 "I/O Duty Cycle and Skew Control", by Xiaobao Wang et al, which are incorporated by reference for all purposes.

BACKGROUND

The present invention relates to high-speed data interfaces, and more particularly to reducing skew between inputs provided at high-speed data interfaces.

The demand for higher speed data interfaces has increased dramatically the past few years, and this increase shows no signs of abating. As an example, huge amounts of data must be transferred from memory devices to other integrated circuits for such applications as music and video playback, image processing, graphics, and others. Many of these demanding applications run on advanced field programmable gate arrays (FPGAs) such as those developed by Altera Corporation of San Jose, Calif.

New interface techniques, such as Double data rate (DDR) and others, have been developed to support these data rates. In a DDR interface, data is read on each (rising and falling) edge of a strobe or clock signal. For example, a typical DDR memory interface can include a data strobe signal (DQS) transmitted in parallel with a group of data signals (DQ) to a receiver. The receiver uses the characteristics of the DQS signal to synchronize itself with the DQ signals. As the receiver (not the memory) typically handles this synchronization, the DQS may be edge-aligned with DQ data signals during read operations and center-aligned with DQ data signals during write operations.

As DDR interfaces increase in speed, the timing margins for communications become smaller and more susceptible to errors. Skew is the difference in arrival time between corresponding portions of the DQS signal and one or more DQ data signals transmitted at the same time. This skew can be caused by differences in signal path lengths between DQS and DQ signal lines, as well as other factors that can vary with operating voltage, temperature, and manufacturing process variations. Thus, the size of the valid sampling time window in which an interface can capture and latch data signals is reduced.

Previous methods of reducing skew include using programmable delay chains with the DQ and DQS signals to selectively delay one or more signals to compensate for skew. This method typically measures the skew at the time of design or manufacturing, which can be costly. These delays are then permanently programmed into the programmable delay chains. However, as these delay values may be fixed at an early stage of manufacturing, this technique does not compensate for certain manufacturing variations (such as process and voltage) and actual operating conditions (such as temperature, humidity, pressure) during operation.

Another prior technique uses a skew locked loop to continuously monitor the skew between DQ and DQS signal paths and adjust delay chain settings accordingly to compensate for the skew between these paths. Although skew locked loops can continuously update delay values to compensate for voltage and temperature variations in skew, they typically require the addition of a dedicated mimic signal path to measure the skew. The addition of a dedicated mimic signal path greatly increases the cost of devices, due to the addition of pins for the mimic path, as well as the cost of systems, due to the increased complexity of circuit boards. Moreover, a single skew locked loop can only track the skew between one DQ data signal path and the DQS signal path. Thus, a skew locked loop cannot determine independent delay values for each DQ data signal to individually compensate each DQ data signal for its own skew with respect to the DQS signal path.

It is therefore desirable to reduce skew from multiple sources and among all DQ and DQS signals at a minimal cost.

SUMMARY

Accordingly, embodiments of the present invention provide circuits, methods and apparatus that reduce skew among signals being received by a data interface. Signal path delays are varied such that data and strobe signals received at a memory interface are calibrated or aligned with each other along a rising and/or falling edge. In one aspect, self-calibration circuitry provides skew adjustment of each data signal path (channel) by determining one or more delays in each input signal path based on relative timings of test signals. The rising or falling edges may be used for this alignment.

According to one exemplary embodiment, a circuit includes control circuitry that sends a data test signal to one ore more data channels and that sends a strobe test signal to at least one strobe channel. Each data channel includes a data input buffer that receives a data signal from an input pad and a data calibration timing device that receives the data test signal. A data delay has an input that is coupled with both the data input buffer and the data calibration timing device. An input timing device is coupled with the data delay and output a signal to the control circuitry.

The strobe channel includes a strobe input buffer that receives a strobe signal from an input pad and a strobe calibration timing device that receives the strobe test signal. A strobe delay has an input coupled with both the strobe input buffer and with the strobe calibration timing device. An output of the strobe delay is coupled with a clock input of each input timing device.

For each data channel, the control circuitry performs a skew adjustment by determining a relative timing between a data test signal and a strobe test signal at the input timing device based on the output of the input timing device. Using the relative timing information, a first edge of the data test signals and the strobe test signal is aligned by adjusting at least one of the delays (i.e. any one of the data or strobe delays). The first edge may be a rising or falling edge.

In one embodiment, a data signal selection device selects a signal from either the data input buffer or the data calibration device to send to the data delay. Also, strobe signal selection device selects a signal from either the strobe input buffer or the strobe calibration device to send to the data delay. In another embodiment, the calibration devices reside in a memory device and send a test signal stored in the memory to the input buffers. In yet another embodiment, a phase shift delay circuit is placed in the strobe channel, e.g., between the strobe input buffer and the strobe delay. In one aspect, the phase shift delay circuit is programmable by the control circuitry to impose a fixed phase shift on a strobe signal or no phase shift.

In one embodiment, the first edge is aligned by incrementing the strobe delay until all of the outputs of the input timing devices have a same logic value, e.g. a "1" or high logic value. Then, for each data channel, a data delay is incremented until the output of the input timing device for that output channel changes a logic value. In another embodiment, one or more additional data delays in each data channel may be programmed by the control circuitry to align a duty cycle and a second edge of data test signals and the strobe test signal at the input timing devices.

According to another exemplary embodiment, a method of calibrating a data interface is provided. Delay units associated with data signal paths and a strobe signal path are initialized, e.g., zero. Test patterns for detecting signal path skew of a portion of the data and strobe signal paths are generated. The test patterns are received via the data signal paths. The test patterns are sampled in response to a strobe signal carried via the strobe signal path. The sampled test pattern values are then analyzed. The delay units of the strobe signal path are changed in response to a determination that the sampled test pattern values of at least one data signal path are equal to a first value. The delay units of the data signal paths are calibrated in response to a determination that the sampled test pattern values are equal to a second value.

In one embodiment for each data signal path, calibrating includes changing the setting of the delay unit, analyzing the sampled test pattern value, repeating changing and analyzing when the sampled test pattern value is equal to the second value, and retaining the setting of the delay unit when the sampled test pattern value is equal to a third value. The third value be the same as the first value.

In some embodiments, generating test patterns includes transmitting the test patterns to calibration timing devices that are coupled with the data signal paths, and outputting the test patterns from the calibration timing devices to their associated data signal paths. In other embodiments, generating test patterns includes storing test pattern data in a memory device, and retrieving the test pattern data from the memory device via the data signal paths.

A better understanding of the nature and advantages of the present invention may be gained with reference to the following detailed description and the accompanying drawings.

DESCRIPTION OF EXEMPLARY EMBODIMENTS

Embodiments of the present invention provide circuits, methods and apparatus that reduce skew among signals being received by a data interface. Self-calibration circuitry can provide post-manufacturing skew adjustment of each input data and strobe channel by determining a delay in each channel path by using test signals. The rising or falling edges may be used for this alignment. This alignment facilitates using new and faster memory interfaces. While specific embodiments of the present invention are well suited to DDR interfaces on FPGA devices, other types of interfaces and other types of devices (e.g., an ASIC) and circuits may be improved by the incorporation of an embodiment of the present invention.

Figure 1:
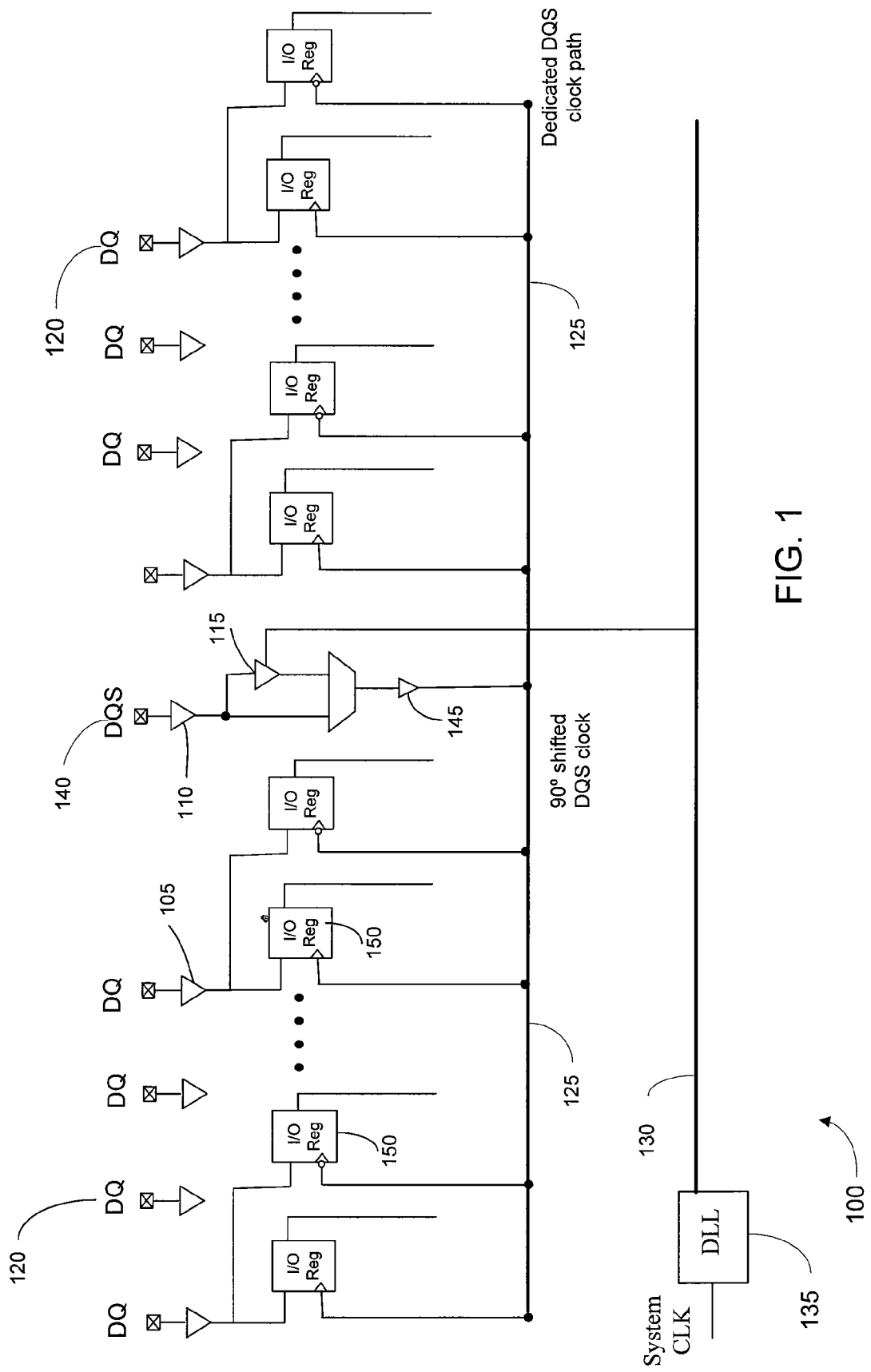
FIG. 1 is a block diagram of a data interface for reading data signals according to an embodiment of the present invention.

FIG. 1 is a block diagram of a data interface 100 for reading data signals according to an embodiment of the present invention. During a read operation, data interface 100 receives data (DQ) signals 120 along with a data strobe (DQS) signal 140, which are sent from a memory device (not shown). Ideally, these DQS and DQ signals are edge aligned, that is, rising and falling edges of the DQS signal are synchronized with the rising and falling edges of the DQ signals. The DQS signal can then be used by data interface 100 to capture the DQ signals. This block diagram illustrates circuitry for one DQ/DQS group of signals having 8 DQ signals 120 and one DQS signal 140. For a 72-bit DDR memory interface, there would be nine x8 DQ/DQS groups.

In this example, a DQ signal 120 goes through an input buffer 105 to get to one of the two DDR input registers 150. The DQS signal 140 goes through an input buffer 110 and a phase shift delay chain 115 before reaching the dedicated DQS clock path 125. The 90° phase shifted DQS CLK signal is then sent to the clock input of the DDR input registers 150. Phase shift delay chain 115 is used to effectively shift an edge of the DQS signal 140 to the middle of the sampling window of the DQ signals 120. As certain DDR input registers 150 are triggered on a rising or falling edge, the middle of the sampling window is set for both bits of data of the DDR DQ signals 120. In one embodiment, the phase shift delay chain 115 is controlled or set by a clock signal 130 originating from a delay locked loop 135.

When arranging a clock tree structure, a balanced structure with minimum skew is desired as it is used as an initial timing trigger. For example, one clock tree covering the whole 72-bit memory interface typically has more clock skew than a shorter clock tree that covers only one x8 DQ/DQS group. Even when care is taken to match signal paths and device sizes, matching errors, such as differences in transistor sizes in different signal paths, can cause skew and timing mismatches. Accordingly, embodiments of the present invention adjustably vary delays provided by elements inserted in the paths of data interface input signals to align the signals. After an edge alignment, the eventual center alignment can be obtained via phase shift delay chain 115.

In one aspect, data interface 100 includes programmable skew adjustment delay chains (not shown) in DQ signal paths and programmable skew adjustment delay chains 145 of the DQS signal path for achieving the alignment. The skew adjustment delay chains are a variable delay chain with a delay setting that can be programmed by a data interface calibration control circuitry. The skew adjustment delay chains of the DQ and DQS signal paths are ideally configured with delay settings so that there is no skew between each DQ signal path and the DQS signal path, disregarding the DQS signal path phase shift caused by the phase shift delay chain 115. An example of the input paths and the calibration delay circuitry used by embodiments of the present invention is shown in the next figure.

Figure 2:
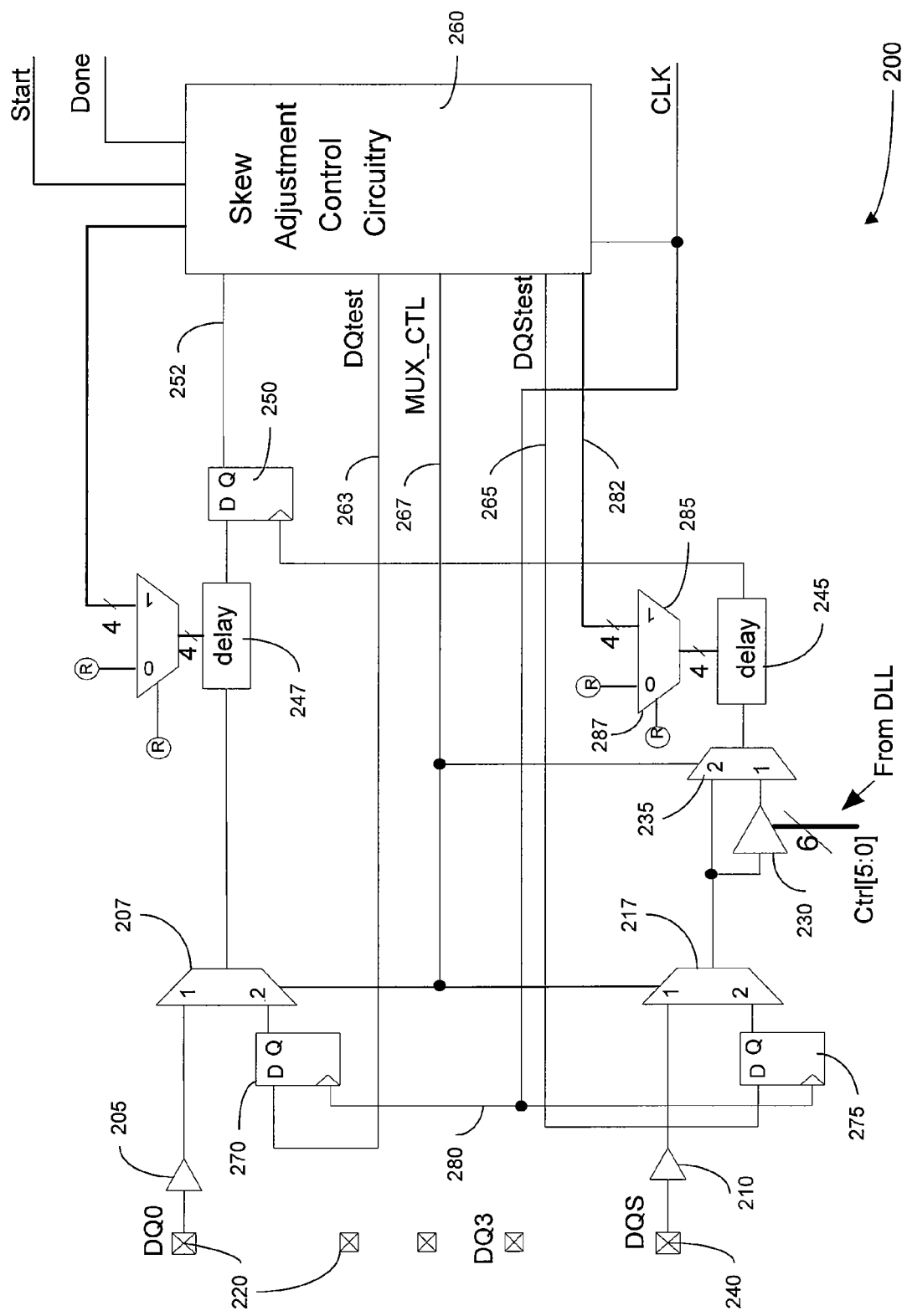
FIG. 2 is a block diagram of a data interface having input paths and delay circuitry according to an embodiment of the present invention.

FIG. 2 is a block diagram of a data interface 200 having input paths (channels) and delay circuitry according to an embodiment of the present invention. For ease of presentation, only one DQ signal path (channel) and one DQS channel is shown. Embodiments may have a DQ/DQS group with multiple DQ input channel for one DQS input channel, for example 8 as shown in FIG. 1. One skilled in the art will appreciate that other configurations and numbers of channels are contemplated by the present invention.

During normal operation of a device having data interface 200, an input DQ signal is received at an input pad 220. The input DQ signal may be a single or multiple data rate signal. The input DQ signal is transmitted to a data input buffer 205, which has an output coupled with a data delay 247. In one embodiment, a signal selection circuit 207, such as a multiplexer (mux) or other suitable device, receives the output from data input buffer 205 at a first data input. During normal operation, the data select of mux 207 may then choose the first data input to transmit to data delay 247. From data delay 247, the DQ signal travels to a data input of an input timing device 250, which may be a single register or a combination of multiple registers (as shown in FIG. 1), or any other combination of latches, flip-flops, or other suitable devices. The clock input of input timing device 250 receives a DQS signal as described below.

An input DQS signal is received at an input pad 240. The input DQS signal is transmitted to a strobe input buffer 210, which has an output coupled with a strobe delay 245. In one embodiment, a mux 217, such as a multiplexer (mux) or other suitable device, receives the output from strobe input buffer 210 at a first data input. During normal operation, the data select of mux 217 may then choose the first data input to transmit to strobe delay 245. The DQS signal then travels from strobe delay 245 to the clock input of input timing device 250 for triggering an output of the input timing device to send data to internal circuitry and logic.

In one aspect, a phase shift delay 230 is used to shift an edge of the DQS signal to the middle of a DQ data bit. In one embodiment, phase shift delay 230 is placed between mux 217 and data delay 245. During normal operation, the output from strobe input buffer 210 (which may travel though mux 217) travels through phase shift delay 230 and is received at a first data input of a phase shift mux 235. In other embodiments, phase shift delay 230 may appear in other places in the strobe channel. For example, phase shift delay 230 may appear after data delay 245 or between strobe input buffer 210 and mux 217.

In one embodiment, test (calibration) registers are inserted just after the input buffers for both the DQ and DQS input channels. These calibration registers are adapted to output test patterns used to determine skew. During such a read calibration, a skew adjustment control circuitry 260 sends out a test signal DQtest on line 263 to a respective data calibration timing device 270 for each input data channel. In one aspect, DQtest may be sent to each DQ channel. In another aspect, different DQtest signal may be sent from different outputs of the control circuitry 260 to a respective DQ channel. The test signal may be produced by a state machine in control circuitry 260. Skew adjustment control circuitry 260 also sends out a DQStest signal to a strobe calibration timing device 275 for a strobe channel.

In one embodiment, calibration timing devices 270 for the read-side calibration are the same devices as the calibration devices used for write-side calibration as described in "Write-Side Calibration for Data Interface" by Yan Chong et al. Ser. No. 11/735,395, which is incorporated by reference for all purposes.

The edges of DQtest signals and the DQStest signal may be used to equilibrate the delays in the input paths from the input pads 220 and 240 to a respective input timing device 250. In one aspect, a respective DQtest signal travels from a data calibration timing device 270 through a data delay 247 to an input timing device 250. In another aspect, a DQStest signal travels from a data calibration timing device 275 through a data delay 245 to one or more input timing devices 250. Thus, the relative timings of the input signals from the input pads 220, 240 to the respective input timing devices 250 may be estimated as being equal to the relative timings from the respective calibration registers 270, 275.

At calibration register 270, a CLK signal on line 280 triggers the output of the DQtest value. In one embodiment, the output of calibration register 270 travels to a second data input of mux 207. One of mux control signals on line 267 can be used to select the proper data input to output from mux 207, as well as the other muxes depicted. In another embodiment, the output of calibration register 270 is received at a node that also receives an output from data input buffer 205. From this point, the DQtest signal travels though the data delay 247 to the input timing device 250, which has an output on line 252 coupled with the control circuitry 260.

At calibration register 275, the CLK signal on line 280 triggers the output of the DQStest value. In one embodiment, the output of calibration register 270 travels to a second data input of mux 217. In another embodiment, the output of calibration register 270 is received at a node that also receives an output from strobe input buffer 210. From this point, the DQStest signal may travel to the second data input of mux 235, bypassing phase shift delay 230. From mux 235, the DQStest signal may travel through data delay 245 and then to the clock input of input registers 250. Triggered by the DQStest signal at the clock input of the input registers 250, the outputs of the input registers 250 are then sent to control circuitry 260. Based on the outputs from input registers 250, control circuitry 260 can identify a relative timing between DQtest and DQStest, and thus also a relative timing between the actual DQ and DQS signals at input registers 250.

Based on these relative timings, control circuitry 250 can transmit controls signals to vary the delays in the channel and clock delays. For example, the strobe delay 245 can be controlled by a signal on line 282. A multiplexer 285 can be set to deliver that control signal to strobe delay 245. In some embodiments, the delay can be programmed into bits in memory 287, such as CRAM bits or other suitable types of memory. Control circuitry 260 may be used to program the CRAM bits, or circuitry that is external to the integrated chip containing data interface 200 may be used to program the CRAM bits. The data delays 247 may be programmed or controlled in a similar manner.

Accordingly, the DQ/DQS test and actual signals may be variably delayed relative to each other, either during configuration or during a calibration routine. The calibration routine may be performed in the final device and in actual operating conditions that would normally affect the skew (such as temperature, humidity, pressure). Thus, for a specific integrated circuit, the timing of each DQ and DQS path (channel) may be matched with signals in every other channel. Embodiments of the present invention encompass a multitude of different methods of performing an alignment. The following is one example.

Figure 3:
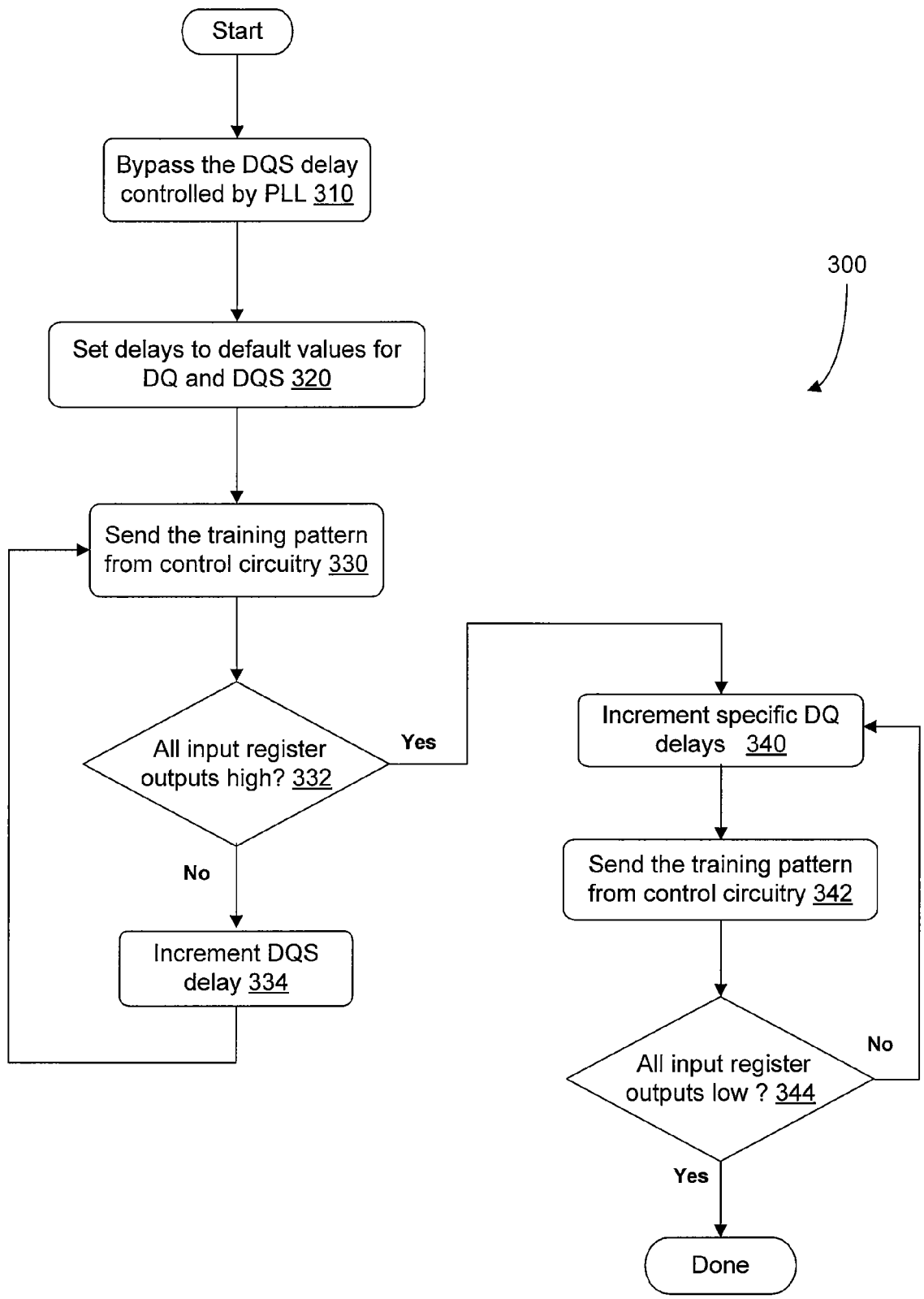
FIG. 3 is a flowchart illustrating a method of aligning input signals according to an embodiment of the present invention.

FIG. 3 is a flowchart illustrating a method 300 of aligning input signals according to an embodiment of the present invention. In a first stage (steps 330-334), the strobe delay is adjusted such that a first edge of a DQS signal arrives at every input timing device 250 just after each DQtest signal arrives. The first edge may be a rising edge or a falling edge of the output signals, but for ease of presentation this example will assume that the first edge is a rising edge. In a second stage (steps 340-344), each data delay is adjusted such that each DQ signal arrives just after the DQS signal.

In step 310, the phase shift delay 230 in the strobe channel is bypassed, e.g., via a mux control signal. In step 320, the data delays and the strobe delay are set to a default value. In one aspect, the default values are zero. In step 330, a first test pattern (DQtest and DQStest) is sent from control circuitry 260 to each channel. In one embodiment, the DQtest pattern for aligning the rising edges has a low to high transition, and the DQtest pattern for aligning the falling edges has a high to low transition. The DQStest pattern may be a simple periodic signal with twice the period of the CLK signal on line 280. Relative timings for pertinent signals are shown via timing diagrams.

Figure 4:
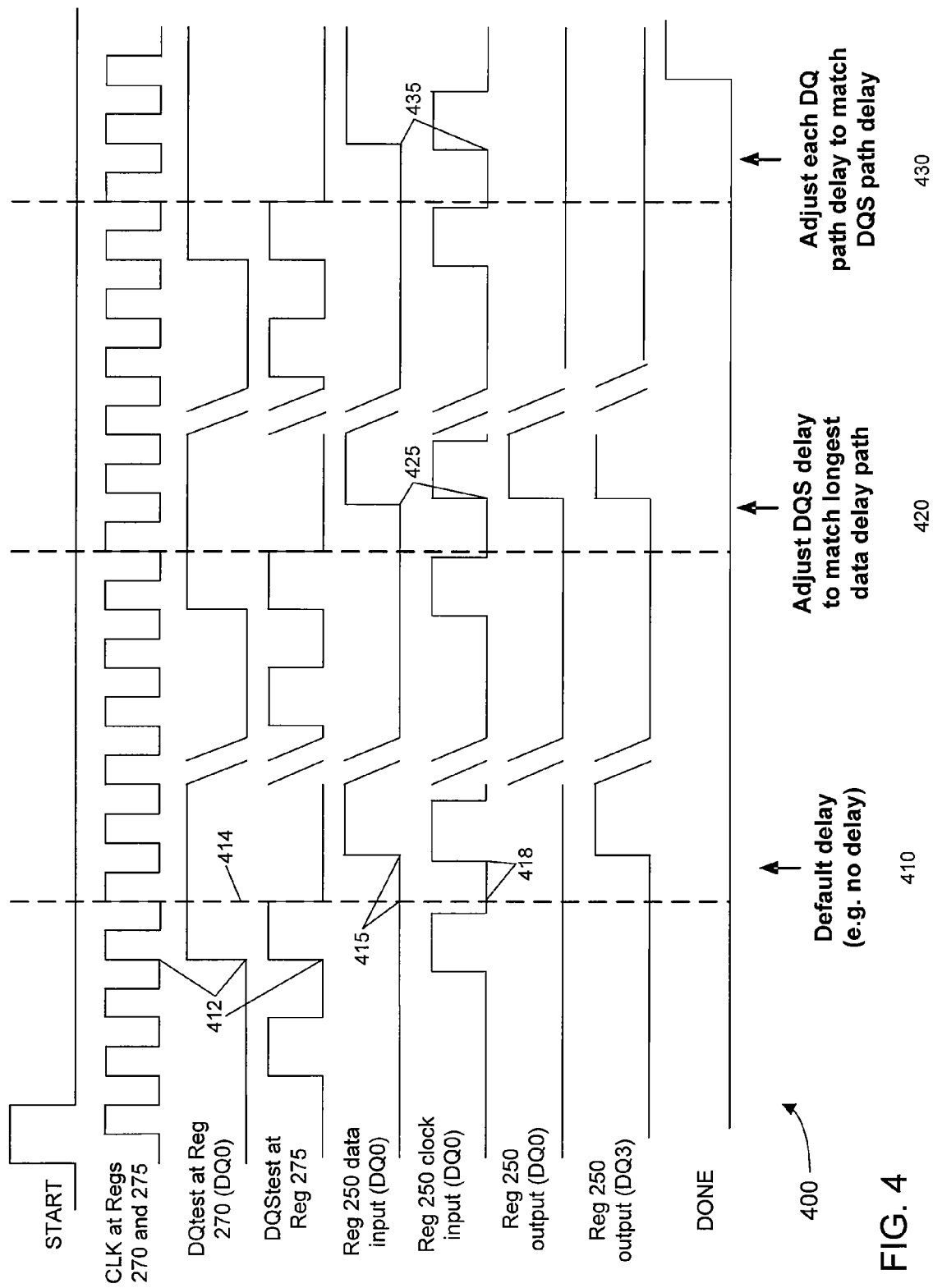
FIG. 4 illustrates a timing diagram of a method according to an embodiment of the present invention.

FIG. 4 illustrates a timing diagram 400 of method 300 according to an embodiment of the present invention. Note that the delay of the DQ input signal path and the delay of the strobe signal path are compared at an input register 250. If the total strobe signal delay is longer, a 1 (or a 0 for falling delay case) is captured in input register 250. If the strobe signal delay is shorter, a 0 (or a 1 for falling delay case) is captured in input register 250.

A first section 410 of timing diagram 400 shows a default relative timing of the CLK signal at calibration registers 270 and 275, the DQtest and DQStest signals at the respective calibration registers, the DQ input at register 250 of channel DQ0, the DQS clock input at register 250 of channel DQ0, and the outputs 252 of input register 250 for channels DQ0 and DQ3. Initially, the CLK signal and the DQtest signal at calibration register 270 have a rising edge aligned at time 412. At calibration register 275, the DQStest and the CLK signal also having a rising edge aligned. Due to a finite setup time of the calibration registers 270 and 275, a high logic is not output from the calibration registers 270, 275 until time 414.

The strobe baseline delay 418 is shown for the strobe signal from strobe calibration register 275 to the clock input of input register 250 of channel DQ0. Strobe baseline delay 418 between rising edges of corresponding pulses is a combination of inherent delay in the strobe channel and the default delay in the strobe delays 245. The data baseline delay 415 is shown for the DQ signal from the data calibration register 270 to the data input of input register 250 of channel DQ0.

As shown, the rising edge of the data input at input register 250 of channel DQ0 occurs just after the rising edge (a positive phase shift) of the DQS signal at the clock input of the same input register. Thus, the output 252 for channel DQ0 stays zero. Whereas, the data input at the input register 250 for channel DQ3 is negatively phase shifted from the DQS signal as the data input at the respective input register 250 for this channel has already transitioned from 0 to 1 before the strobe signal transitions at clock input of that respective input register 250. This can be seen by the fact that the output 252 of the input register 250 of this channel becomes '1'.

In step 332, the control circuitry 260 determines whether all of the input register outputs 252 are high. Thus, for the example of FIG. 4, it would be determined that channel DQ0 is not high. Accordingly, in step 334 strobe delay 245 is incremented. The steps 330-334 are repeated until all of the input registers 250 capture 1s, which means that the strobe path delay will match (to within the setup time) with the longest data path delay. In other embodiments, where the falling edge is aligned in the first stage, strobe delay 245 would be incremented until only 0s are captured. Any of the stages may be done by any number of methods including the example of method 300. For example, if the default delay values are non-zero, the first stage may be accomplished by only varying (incrementing or decrementing) the data delays 247.

Section 420 of FIG. 4 shows the result of increasing strobe delay 245. The delay 425 between the signals at the clock input and data input of the input register 250 of channel DQ0 now shows that the data signal of channel DQ0 is negatively phase shifted compared to the strobe signal of channel DQ0, as are all of the other input signals.

In the next stage of method 300, the data delays 247 in each data input channel may be individually incremented. In step 340, a rising edge pattern is sent again. In step 342, control circuitry 260 determines whether all of the input register outputs are low. In the first pass, this should not be true as all of the outputs were just '1'. In step 344, data delay 247 for each channel that is not zero is incremented. If an output is already low then a delay for that channel is not incremented. Steps 340-344 are repeated until all of the outputs of the input registers 250 change from 1 to 0. By doing so, the rising and/or falling edge delay for each input channel will match with the strobe path delay.

Section 430 of FIG. 4 shows the result of increasing the respective data delays 247. The delay 435 between the signals at the clock input and data input of the input register 250 of channel DQ0 now show that the data signal of DQ0 is positively (zero or greater) phase shifted compared to the CLK signal. All of the other output signals have similar timings as evidenced by the low output from the input registers 250 of the other channels.

Note that during normal operation, the DQ and DQS signals need to be center aligned. Thus, after being edge aligned in the skew adjustment process, the center aligning of the DQ and DQS signals can be done with mux control signal 267 that causes the mux 235 to select the first data input which is shifted by 90° by phase shift delay 230.

In addition to aligning a first edge as described above regarding FIGS. 3 and 4, a second edge of the DQ and DQS signals may be aligned as well as an alignment of the duty cycles of the DQ and DQs signals. In one embodiment, more than one data delay element and more than one strobe delay element may be located in the data signal paths and/or the strobe signal path after the respective calibration devices. In one aspect, at least one set of these delay elements has independent control over rising and falling edges. Any delay elements having this property may be used, such as those described in "Duty Cycle and Skew Control", by Xiaobao Wang et al. Ser. No. Ser. No. 11/735,401. For example, different delays may be used in an input buffer as they are used in an output buffer.

In another aspect, delay elements from data channels and a strobe channel may be set to the same delay as described in "Write-Side Calibration for Data Interface," referenced above. In one embodiment, the duty cycle is aligned after the aligning of the first edges. After this alignment, the second edges of the DQ and DQS signals may be aligned again as described in "Write-Side Calibration for Data Interface," referenced above.

In a further embodiment, a similar scheme can be used to also compensate for skew in the signals paths between an external memory device and a data interface. In this embodiment, the test pattern (signal) is written in the memory device from which the interface receives data, and then read back. Thus, the calibration registers may be the memory output registers, which would thus have an input coupled with control circuitry 260. The test patterns read from memory and sent through memory timing devices are equivalent to the test patterns transmitted from control circuitry 260 as discussed above. The memory timing devices (output registers) may simply use the internal clock of the external memory device.

By adjusting the delay settings for the DQ and DQS signal paths as described above while reading these test patterns from memory, the skew between the external memory device and the data interface can be measured and compensated for. This embodiment compensates not only for the skew introduced by components within the data interface, but also for skew introduced from the memory device, circuit board layout, device packages, and other device features. Devices including embodiments of the invention can perform calibration to compensate for skew at the power up or anytime during operation as needed. In some embodiments, the normal operation of the memory with the interface is stopped during calibration.

Embodiments of the invention can be implemented on many types of devices, including programmable devices, and many types of interfaces, including single data rate and double data rate memory interfaces. Further embodiments can be envisioned to one of ordinary skill in the art after reading the attached documents. For example, although the invention has been discussed with reference to programmable devices, it is equally applicable to any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

Figure 5:
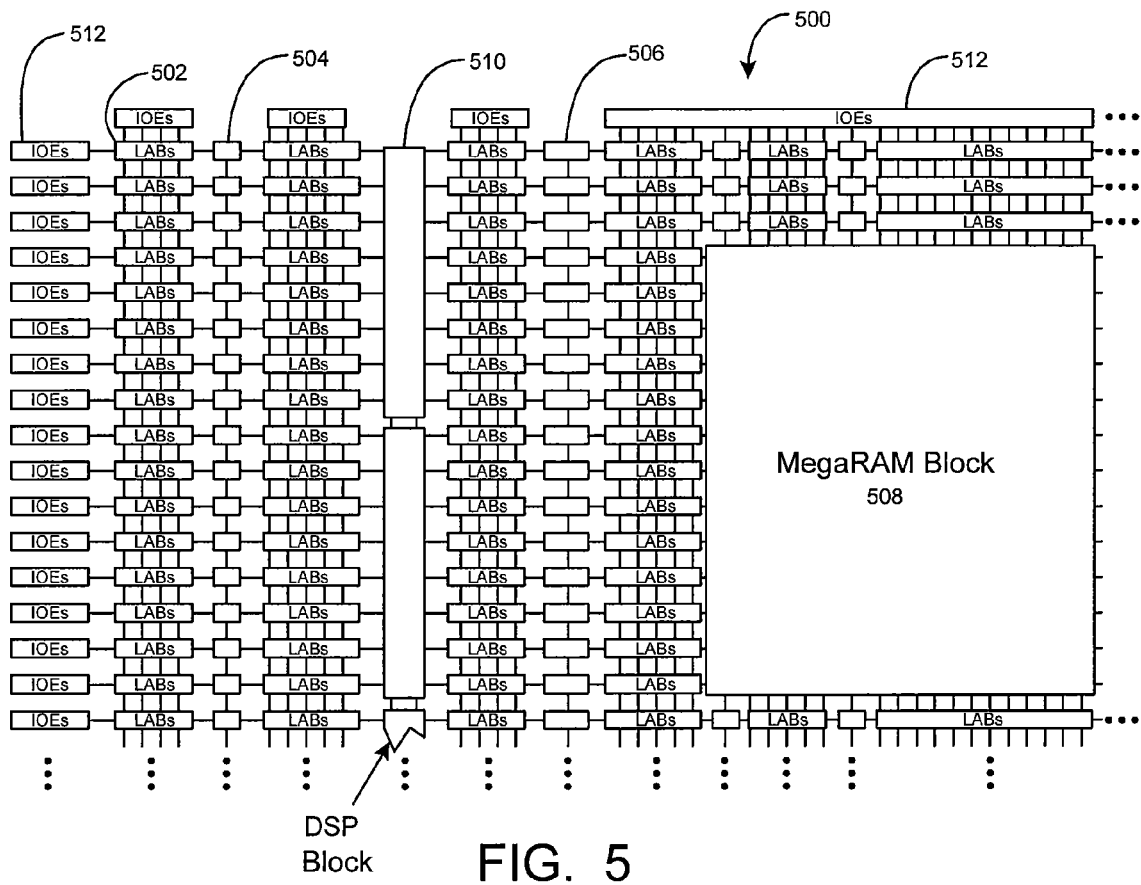
FIG. 5 is a simplified block diagram of a programmable logic device that may benefit by incorporating embodiments of the present invention.

FIG. 5 is a simplified partial block diagram of an exemplary high-density programmable logic device (PLD) 500 wherein techniques according to the present invention can be utilized. PLD 500 includes a two-dimensional array of programmable logic array blocks (or LABs) 502 that are interconnected by a network of column and row interconnections of varying length and speed. LABs 502 include multiple (e.g., 10) logic elements (or LEs), an LE being a small unit of logic that provides for efficient implementation of user defined logic functions.

PLD 500 also includes a distributed memory structure including RAM blocks of varying sizes provided throughout the array. The RAM blocks include, for example, 512 bit blocks 504, 4K blocks 506 and an M-Block 508 providing 512K bits of RAM. These memory blocks may also include shift registers and FIFO buffers. PLD 500 further includes digital signal processing (DSP) blocks 510 that can implement, for example, multipliers with add or subtract features.

PLD 500 also includes input/output elements (IOEs) 512 for providing a communication interface with circuits and devices that are external to PLD 500. These other circuits or devices may reside on another circuit board, a same circuit board, or even the same chip. It is to be understood that PLD 500 is described herein for illustrative purposes only and that the present invention can be implemented in many different types of PLDs, FPGAs, and the other types of digital integrated circuits.

While PLDs of the type shown in FIG. 5 provide many of the resources required to implement system level solutions, the present invention can also benefit systems wherein a PLD is one of several components. FIG. 8 shows a block diagram of an exemplary digital system 800, within which the present invention may be embodied. System 800 can be a programmed digital computer system, digital signal processing system, specialized digital switching network, or other processing system. Moreover, such systems may be designed for a wide variety of applications such as telecommunications systems, automotive systems, control systems, consumer electronics, personal computers, electronic displays, Internet communications and networking, and others. Further, system 800 may be provided on a single board, on multiple boards, or within multiple enclosures.

Figure 6:
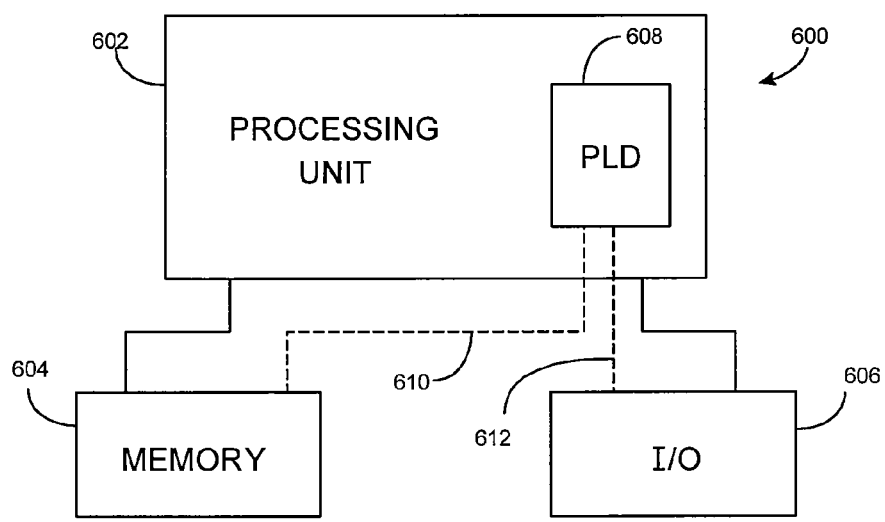
FIG. 6 is a block diagram of an electronic system that may benefit by incorporating embodiments of the present invention.

System 600 includes a processing unit 602, a memory unit 604 and an I/O unit 606 interconnected together by one or more buses. According to this exemplary embodiment, a programmable logic device (PLD) 608 is embedded in processing unit 602. PLD 608 may serve many different purposes within the system in FIG. 6. PLD 608 can, for example, be a logical building block of processing unit 602, supporting its internal and external operations. PLD 608 is programmed to implement the logical functions necessary to carry on its particular role in system operation. PLD 608 may be specially coupled to memory 604 through connection 610 and to I/O unit 606 through connection 612.

Processing unit 602 may direct data to an appropriate system component for processing or storage, execute a program stored in memory 604 or receive and transmit data via I/O unit 606, or other similar function. Processing unit 602 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 608 can control the logical operations of the system. In an embodiment, PLD 608 acts as a reconfigurable processor, which can be reprogrammed as needed to handle a particular computing task. Alternately, programmable logic device 608 may itself include an embedded microprocessor. Memory unit 604 may be a random access memory (RAM), read only memory (ROM), fixed or flexible disk media, PC Card flash disk memory, tape, or any other storage means, or any combination of these storage means.

Embodiments of the present invention may be used to improve circuits that interface with the memory unit 604. While embodiments of the present invention particularly benefit these interface circuits when memory unit 604 is a double-data rate (DDR) type memory, embodiments may benefit other multiple-data rate types interfaces that are either now known or later developed.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A circuit comprising:
   control circuitry having a first output that transmits a data test signal and having a second output that transmits a strobe test signal;
   one or more data channels, each including:
      a data input buffer that receives a data signal from an input pad;

a data calibration timing device having a data input coupled with the first output of the control circuitry;

a data delay having an input coupled with the data input buffer and coupled with the data calibration timing device; and an input timing device having a data input coupled with the data delay and having an output coupled with the control circuitry; and a strobe channel including:

a strobe input buffer that receives a strobe signal from an input pad;

a strobe calibration timing device having a data input coupled with the second output of the control circuitry;

a strobe delay having an input coupled with the strobe input buffer and coupled with the strobe calibration timing device and having an output coupled with a clock input of each input timing device;

wherein the control circuitry is adapted to:

determine, for each data channel, a relative timing between a data test signal at the data input of the input timing device and a strobe test signal at the clock input of the input timing device, wherein the relative timing is based on the output of the input timing device; and align a first edge of the data test signals and the strobe test signal by adjusting at least one of the delays.

2. The circuit of claim 1 further comprising:

a data signal selection device, wherein for each data channel:

the data input buffer has an output coupled with a first input of the data signal selection device, and the data calibration timing device has an output coupled with a second input of the data signal selection device, wherein an output of the data selection device is coupled with the input of the data delay; and a strobe signal selection device, wherein for the strobe channel:

the strobe input buffer has an output coupled with a first input of the strobe signal selection device, and the strobe calibration timing device has an output coupled with a second output of the strobe signal selection device, wherein an output of the strobe selection device is coupled with the input of the strobe delay.

3. The circuit of claim 1 further comprising:

a phase shift delay circuit having an input coupled with an output of the strobe input buffer and having an output coupled with the clock input of the input timing device, wherein the phase shift delay circuit is programmable by the control circuitry to impose a fixed phase shift on a strobe signal or no phase shift.

4. The circuit of claim 1 wherein the data delays for each data channel and the strobe delay are all adjustable, and wherein control circuitry is adapted to adjust the data delay for each data channel and the strobe delay.

5. The circuit of claim 1 wherein the relative timing is determined from a logic value of the output of the input timing device.

6. The circuit of claim 1 wherein the control circuitry is adapted to align a first edge by:

incrementing the strobe delay until all of the outputs of the input timing devices have a same logic value; and for each data channel, incrementing a data delay until the output of the input timing device for that data channel changes a logic value.

7. The circuit of claim 6 wherein the same logic value is a high logic value.

8. The circuit of claim 1 further comprising:

one or more additional data delays in each data channel, wherein the control circuitry is further adapted to also align a duty cycle and a second edge of data test signals and the strobe test signal at the input timing devices by using the one or more additional data delays.

9. The circuit of claim 1 wherein the first edge of the data test signals and the strobe test signal is the rising edge.

10. The circuit of claim 1 wherein the strobe calibration timing device and the data calibration timing device reside in a memory module.

11. A method of aligning input signals in a data interface, the method comprising:

transmitting a data test signal generated by control circuitry to data inputs of a plurality of data calibration timing devices, each of a respective data channel;

transmitting a strobe test signal generated by control circuitry to a strobe calibration timing device;

based on a clock signal:

transmitting the data test signal from each data calibration timing device through one or more data delays to a respective input timing device; and transmitting the strobe test signal from the strobe calibration timing device through one or more strobe delays to each of the respective input timing devices;

determining, for each data channel, a relative timing between a data test signal at the data input of the input timing device and a strobe test signal at the clock input of the input timing device, wherein the relative timing is based on the output of the input timing device; and aligning a first edge of the data test signals and the strobe test signal by adjusting at least one of the delays.

12. The method of claim 11 wherein the data calibration timing devices and the strobe calibration timing device reside in a memory module, and further comprising:

storing the data test signal and the strobe test signal in the memory module prior to transmitting the signals to the respective data and strobe calibration timing devices.

13. The method of claim 11 wherein the data interface is a double-data rate interface.

14. The method of claim 11 wherein the data interface is on a field programmable gate array.

15. The method of claim 11 wherein aligning a first edge comprises:

incrementing a first clock delay until all of the outputs of the calibration timing devices have a same logic value; and for each output channel, incrementing a first channel delay until the output of the calibration timing device for that output channel changes a logic value.

16. The method of claim 11 further comprising:

aligning a duty cycle and a second edge of data test signals and the strobe test signal at the input timing devices using one or more additional data delays in each data channel.

17. A method of calibrating a data interface, the method comprising:

initializing delay units associated with data signal paths and a strobe signal path to initial delay settings;

generating test patterns adapted to detect signal path skew associated with at least a portion of the data and strobe signal paths;

receiving the test patterns via the data signal paths;

sampling the test patterns received via the data signal paths in response to a strobe signal carried via the strobe signal path;

analyzing the sampled test pattern values;

changing the delay setting of the delay unit associated with the strobe signal path in response to a determination that the sampled test pattern values of at least one data signal path are equal to a first value; and calibrating the delay settings of the delay units associated with the data signal paths in response to a determination that the sampled test pattern values are equal to a second value, wherein the first value is different from the second value.

18. The method of claim 17 wherein, for each data signal path, calibrating the delay settings of the delay units associated with the data signal paths comprises:

changing the delay setting of the associated delay unit for that data signal path;

analyzing the sampled test pattern value of that data signal path;

repeating changing the delay setting of the associated delay unit and analyzing the sampled test pattern value of that data signal path in response to a determination that the sampled test pattern value is equal to the second value; and retaining the delay setting of the delay unit in response to a determination that the sampled test pattern value is equal to a third value.

19. The method of claim 18 wherein the third value is equal to the second value.

20. The method of claim 17 wherein generating test patterns comprises:

transmitting the test patterns to calibration timing devices that are coupled with the data signal paths; and outputting the test patterns from the calibration timing devices to their associated data signal paths.

21. The method of claim 17 wherein generating test patterns comprises:

storing test pattern data in a memory device; and retrieving the test pattern data from the memory device via the data signal paths.

22. The circuit of claim 1 wherein the circuit is an integrated circuit.

23. The circuit of claim 1 wherein the data calibration timing device, the input timing device, and the strobe calibration timing device each include a register.

* * * * *